(12) United States Patent
Elowe et al.

(10) Patent No.: US 8,921,148 B2
(45) Date of Patent: Dec. 30, 2014

(54) MOISTURE RESISTANT PHOTOVOLTAIC DEVICES WITH EXPOSED CONDUCTIVE GRID

(75) Inventors: Paul R. Elowe, Midland, MI (US); Marty W. DeGroot, Midland, MI (US); Michael E. Mills, Midland, MI (US); Matt A. Stempki, Midland, MI (US)

(73) Assignee: Dow Global Technologies LLC, Midland, MI (US)

( * ) Notice: Subject to any disclaimer, the term of this patent is extended or adjusted under 35 U.S.C. 154(b) by 496 days.

(21) Appl. No.: 13/005,426

(22) Filed: Jan. 12, 2011

(65) Prior Publication Data
US 2011/0168243 A1 Jul. 14, 2011

Related U.S. Application Data

(60) Provisional application No. 61/294,878, filed on Jan. 14, 2010.

(51) Int. Cl.
*H01L 21/00* (2006.01)
*H01L 31/00* (2006.01)
(Continued)

(52) U.S. Cl.
CPC ............ *H01L 31/0749* (2013.01); *Y02E 10/541* (2013.01); *H01L 31/02167* (2013.01); *H01L 31/022425* (2013.01); *H01L 31/0322* (2013.01)
USPC ........................................... 438/96; 136/256

(58) Field of Classification Search
CPC .............. H01L 31/022425; H01L 31/022433; H01L 31/0224; H01L 31/022408; H01L 31/0264; H01L 31/02725; H01L 31/0296; H01L 31/02966; H01L 31/032; H01L 31/0321; H01L 31/0322; H01L 31/0323; H01L 31/0328; H01L 31/0336; H01L 31/03365; H01L 31/0324; H01L 31/0326; H01L 31/0327; H01L 31/039
USPC ................................................. 136/255, 256
See application file for complete search history.

(56) References Cited

U.S. PATENT DOCUMENTS 3,988,167 A * 10/1976 Kressel et al. ................. 136/256
4,401,839 A    8/1983 Pyle
(Continued)

FOREIGN PATENT DOCUMENTS

DE    44 42 824        1/1996
DE    196 11 410       8/1997
(Continued)

OTHER PUBLICATIONS

Wasa et al., "Handbook of Sputter Deposition Technology Principles, Technology and Applications," 1992; Noyes Publications, Park Ridge, New Jersey, USA.*

(Continued)

*Primary Examiner* — Eli Mekhlin
(74) *Attorney, Agent, or Firm* — Kagan Binder, PLLC

(57) ABSTRACT

The present invention provides strategies for improving the adhesion among two or more of transparent conducting oxides, electrically conductive grid materials, and dielectric barrier layers. As a consequence, these strategies are particularly useful in the fabrication of heterojunction photovoltaic devices such as chalcogenide-based solar cells. When the barrier is formed and then the grid is applied to vias in the barrier, the structure has improved moisture barrier resistance as compared to where the barrier is formed over or around the grid. Adhesion is improved to such a degree that grid materials and dielectric barrier materials can cooperate to provide a hermetic seal over devices to protect against damage induced by environmental conditions, including damage due to water intrusion. This allows the collection grids to be at least partially exposed above the dielectric barrier, making it easy to make electronic connection to the devices.

11 Claims, 2 Drawing Sheets

(51) Int. Cl.
*H01L 31/0216* (2014.01)
*H01L 31/0224* (2006.01)
*H01L 31/032* (2006.01)
*H01L 31/0749* (2012.01)

(56) References Cited

U.S. PATENT DOCUMENTS

| | | | |
|---|---|---|---|
| 4,646,424 A * | 3/1987 | Parks et al. | 438/158 |
| 4,726,850 A | 2/1988 | Wenham et al. | |
| 4,748,130 A | 5/1988 | Wenham et al. | |
| 4,754,544 A | 7/1988 | Hanak | |
| 4,952,904 A | 8/1990 | Johnson et al. | |
| 5,181,968 A * | 1/1993 | Nath et al. | 136/256 |
| 5,626,688 A | 5/1997 | Probst et al. | |
| 5,870,129 A | 2/1999 | Ikegawa et al. | |
| 5,942,446 A * | 8/1999 | Chen et al. | 438/734 |
| 5,948,176 A | 9/1999 | Ramanathan et al. | |
| 6,020,556 A | 2/2000 | Inaba et al. | |
| 6,091,019 A * | 7/2000 | Sakata et al. | 136/256 |
| 6,091,021 A | 7/2000 | Ruby et al. | |
| 6,259,016 B1 | 7/2001 | Negami et al. | |
| 6,383,576 B1 | 5/2002 | Matsuyama | |
| 7,033,930 B2 | 4/2006 | Kozhukh et al. | |
| 7,253,521 B2 | 8/2007 | Ahn et al. | |
| 7,271,333 B2 | 9/2007 | Fabick et al. | |
| 7,425,506 B1 | 9/2008 | Kailasam | |
| 2004/0161872 A1 | 8/2004 | Gonsiorawski et al. | |
| 2007/0175508 A1* | 8/2007 | Park | 136/256 |
| 2008/0053519 A1 | 3/2008 | Pearce et al. | |
| 2008/0105302 A1* | 5/2008 | Lu et al. | 136/258 |
| 2008/0178932 A1* | 7/2008 | Den Boer et al. | 136/256 |
| 2008/0223436 A1 | 9/2008 | den Boer et al. | |
| 2008/0245765 A1* | 10/2008 | Khaselev et al. | 216/13 |
| 2008/0251117 A1* | 10/2008 | Schubert et al. | 136/255 |
| 2009/0126791 A1 | 5/2009 | Lu et al. | |
| 2009/0320916 A1 | 12/2009 | Yuan et al. | |
| 2010/0012185 A1 | 1/2010 | Schmid et al. | |
| 2010/0032701 A1* | 2/2010 | Fudeta | 257/98 |
| 2010/0144079 A1* | 6/2010 | Mayer et al. | 438/57 |
| 2010/0243046 A1 | 9/2010 | Degroot et al. | |
| 2011/0192453 A1 | 8/2011 | DeGroot et al. | |

FOREIGN PATENT DOCUMENTS

| | | |
|---|---|---|
| DE | 197 07 280 | 8/1998 |
| EP | 1 365 458 | 11/2003 |
| JP | 2000-058885 | 2/2000 |
| JP | 2001 513264 | 12/2001 |
| JP | 2005-109360 | 4/2005 |
| JP | 2005-317563 | 11/2005 |
| JP | 2008-274334 | 11/2008 |
| KR | 100850641 | 8/2008 |
| WO | WO 02/15282 | 2/2002 |
| WO | WO 2006/005116 | 1/2006 |
| WO | WO 2008107194 A2 * | 9/2008 |
| WO | WO 2009/012346 | 1/2009 |
| WO | WO 2009/078936 | 6/2009 |
| WO | WO 2009/140117 | 11/2009 |

OTHER PUBLICATIONS

Thin Solid Films, Tucci et al., "Innovative design of amorphous/crystalline silicon heterojunction solar cell", vol. 516, p. 6771-6774, (2008).

Prog. Photovolt. Res. Appl., Engelhart et al., "Laser Ablation of $SiO^2$ for Locally Contacted Si Solar Cells With Ultra-short Pulses", vol. 15, p. 521-527, (2007).

Plasma Process. Polym., Wolf et al., "Moisture Barrier Films Deposited on PET by ICPECVD of $SiN_x$," vol. 4, p. S185-S189, (2007).

* cited by examiner

MOISTURE RESISTANT PHOTOVOLTAIC DEVICES WITH EXPOSED CONDUCTIVE GRID

PRIORITY

The present nonprovisional patent Application claims priority under 35 U.S.C. §119(e) from U.S. Provisional patent application having Ser. No. 61/294,878, filed on Jan. 14, 2010, by Elowe et al. and titled MOISTURE RESISTANT PHOTOVOLTAIC DEVICES WITH EXPOSED CONDUCTIVE GRID, wherein the entirety of said provisional patent application is incorporated herein by reference.

FIELD OF THE INVENTION

The present invention relates to photovoltaic devices of the type incorporating a conductive collection grid that facilitates ease of making external electrical connections, and more particularly to heterojunction photovoltaic devices, especially chalcogen-based photovoltaic devices, with improved adhesion between such grids and other components of the devices, wherein the improved adhesion helps provide the devices with enhanced moisture resistance.

BACKGROUND OF THE INVENTION

Both n-type chalcogenide compositions and/or p-type chalcogenide compositions have been incorporated into components of heterojunction photovoltaic devices. The p-type chalcogenide compositions have been used as the photovoltaic absorber region in these devices. Illustrative p-type, photovoltaically active chalcogenide compositions often include sulfides and/or selenides of at least one or more of aluminum (Al), copper (Cu), indium (In), and/or gallium (Ga). More typically at least two or even all three of Cu, In, and Ga are present. Such materials are referred to as CIS, CIAS, CISS, CIGS, and/or CIGSS compositions, or the like (collectively CIGS compositions hereinafter).

Absorbers based upon CIGS compositions offer several advantages. As one, these compositions have a very high cross-section for absorbing incident light. This means that a very high percentage of incident light can be captured by CIGS-based absorber layers that are very thin. For example, in many devices, CIGS-based absorber layers have a thickness in the range of from about 2 µm to about 3 µm. These thin layers allow devices incorporating these layers to be flexible. This is in contrast to silicon-based absorbers. Silicon-based absorbers have a lower cross-section for light capture and generally must be much thicker to capture the same amount of incident light. Silicon-based absorbers tend to be rigid, not flexible.

The n-type chalcogenide compositions, particularly those incorporating at least cadmium, have been used in photovoltaic devices as buffer layers. These materials generally have a band gap that is useful to help form a p-n junction proximal to the interface between the n-type and p-type materials. Like p-type materials, n-type chalcogenide layers can be thin enough to be used in flexible photovoltaic devices.

These chalcogenide based photovoltaic cells frequently also include other layers such as transparent conductive layers and window layers.

Heterojunction photovoltaic cells, especially those based on p-type and n-type chalcogenides, are water sensitive and can unduly degrade in the presence of too much water. Also, the thinner, flexible layers are vulnerable to thermal and other delamination or cracking stresses. Delamination and cracking not only can undermine device performance, but the resultant delamination and cracking also can exacerbate moisture intrusion. Therefore, to enhance service life, strong adhesion between device components is important to resist delamination, cracking, and moisture intrusion.

To protect heterojunction photovoltaic solar sells, especially chalcogenide-based solar cells, from detrimental moisture degradation, one or more hermetic barrier films can be deposited over the devices. However, such barrier films may tend to show poor adhesion to the top surface(s) of the device. In particular, the adhesion between barrier materials and underlying transparent conducting oxide (TCO) materials and/or conductive collection grids may not be as strong as desired. Additionally, the adhesion between the grids and other materials, such as the TCO compositions, also may be poor. These issues can result in undue delamination or in a rupture of the continuous hermetic barrier film and/or open pathways allowing water intrusion to reach the chalcogenide compositions too easily. This can lead to subsequent device performance degradation and ultimately failure. Moreover, since the barrier film is typically a dielectric, providing a continuous electrically conductive path for electricity collection throughout the interconnecting cells with one another becomes a challenge.

It is known to use silicon nitride films for passivation in the context of silicon-based solar cells. However, silicon-based solar cells tend to be thicker and much more rigid than chalcogenide-based cells. Accordingly, interlayer adhesion is much less of an issue in the context of silicon-based solar cells. Additionally, silicon-based solar cells have good moisture resistance so that moisture intrusion is much less of a concern for silicon-based solar cells.

SUMMARY OF THE INVENTION

The present invention provides strategies for improving the adhesion among two or more of transparent conducting oxides, electrically conductive grid materials, and dielectric barrier layers. As a consequence, these strategies are particularly useful in the fabrication of heterojunction solar cells such as chalcogenide-based solar cells. Resultant cells are more resistant to delamination, rupture, and/or moisture intrusion. It is expected that devices protected by the strategies of the present invention have enhanced service life. Surprisingly the inventors have found that if the barrier is formed and then the grid is applied to vias in the barrier, the structure has improved moisture resistance as compared to where the barrier is formed over or around the grid. Adhesion is improved to such a degree that grid materials and dielectric barrier materials can cooperate to provide a hermetic seal over devices to protect against damage induced by environmental conditions, including damage due to water intrusion. This allows the collection grids to be at least partially exposed above the dielectric barrier, making it easy to make electronic connection to the devices.

In one aspect, the invention provides a photovoltaic device that comprises:

a) a substrate having a light incident surface and a backside surface and comprising at least one photovoltaic absorber, preferably chalcogenide-containing photovoltaic absorber, wherein the substrate includes at least one transparent conducting oxide layer interposed between the absorber and the light incident surface;

b) a dielectric barrier layer positioned over the transparent conducting oxide layer;

c) at least one via present in the dielectric barrier layer that terminates at a location in the device such that the via provides open communication to the transparent conducting oxide layer through the dielectric barrier layer without penetrating all the way through the transparent conducting oxide layer; and d) an electrical contact that is electrically connected to the transparent conducting oxide layer, said electrical contact comprising a base formed in the via and a cap projecting above the dielectric barrier layer.

In another aspect, the present invention relates to a photovoltaic device, comprising:

a) a substrate having a light incident surface and a backside surface and comprising at least one photovoltaic absorber, preferably chalcogenide-containing photovoltaic absorber, wherein the substrate includes at least one transparent conducting oxide layer interposed between the absorber and the light incident surface;

b) a dielectric barrier layer positioned over the transparent conducting oxide layer;

c) at least one via present in the dielectric barrier layer that terminates at a location in the device such that the via provides open communication to the transparent conducting oxide layer through the dielectric barrier layer without penetrating all the way through the transparent conducting oxide layer; and d) an electrical contact that is electrically connected to the transparent conducting oxide layer, said electrical contact comprising a base formed in the via and a cap projecting above the dielectric barrier layer that is wider in at least one dimension than at least a portion of the via.

In another aspect, the invention provides a method of making a photovoltaic device. The method comprises the steps of:

a) providing a substrate having a light incident surface and a backside surface and comprising at least one photovoltaic absorber, preferably a chalcogenide containing photovoltaic absorber, wherein the substrate includes at least one transparent conducting oxide layer interposed between the absorber and the light incident surface;

b) causing a dielectric barrier layer to be positioned over the transparent conducting oxide layer;

c) causing at least one via to be present in the dielectric barrier layer that terminates at a location in the device such that the via provides open communication to the transparent conducting oxide layer through the dielectric barrier layer without penetrating all the way through the transparent conducting oxide layer; and d) forming an electrical contact that is electrically connected to the transparent conducting oxide layer, said electrical contact comprising a base formed in the via and a cap projecting above the dielectric barrier layer.

BRIEF DESCRIPTION OF THE DRAWINGS

The above mentioned and other advantages of the present invention, and the manner of attaining them, will become more apparent and the invention itself will be better understood by reference to the following description of the embodiments of the invention taken in conjunction with the accompanying drawings, wherein.

DETAILED DESCRIPTION OF PRESENTLY PREFERRED EMBODIMENTS

The embodiments of the present invention described below are not intended to be exhaustive or to limit the invention to the precise forms disclosed in the following detailed description. Rather the embodiments are chosen and described so that others skilled in the art may appreciate and understand the principles and practices of the present invention. All patents, pending patent applications, published patent applications, and technical articles cited herein are incorporated herein by reference in their respective entireties for all purposes.

Figure 1:
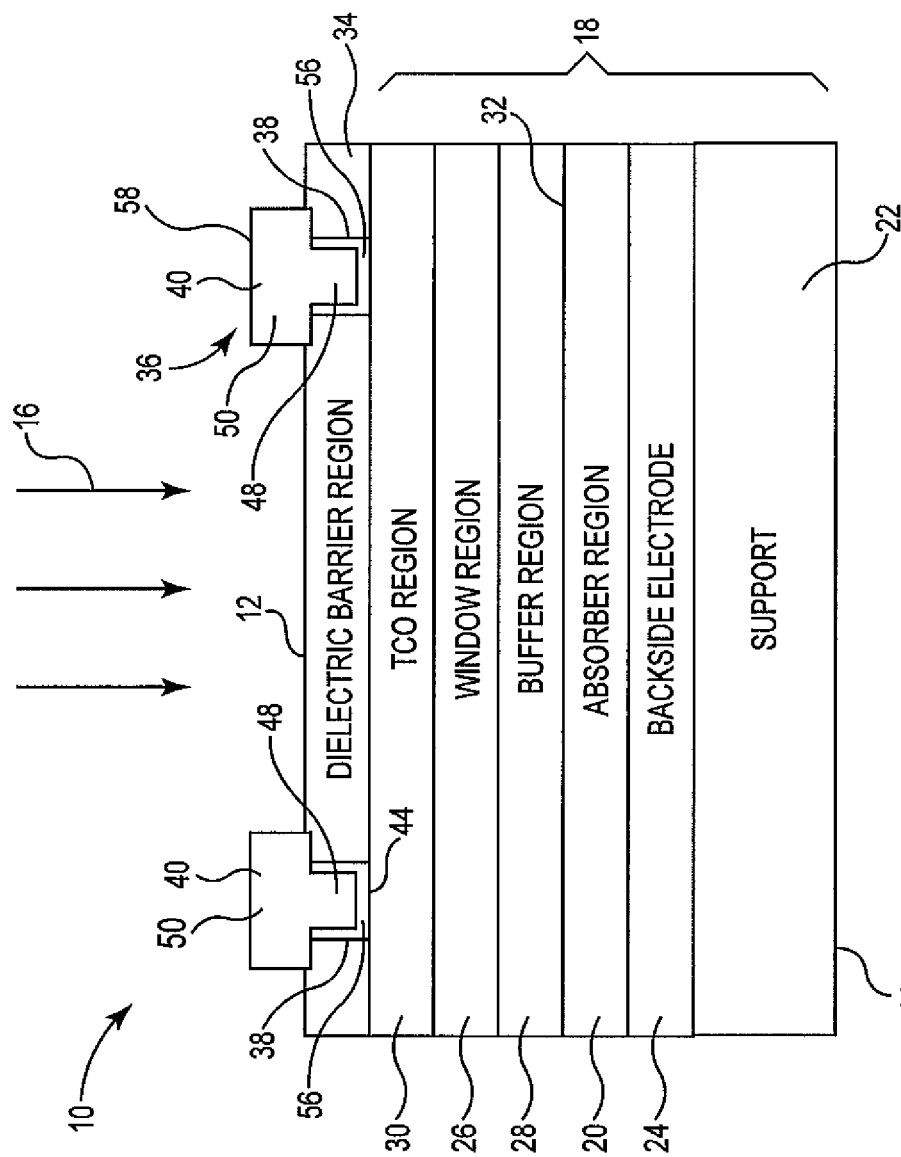
FIG. 1 is a schematic cross-section of one embodiment of a photovoltaic device according to principles of the present invention.

FIG. 1 schematically shows one embodiment of a photovoltaic device 10 of the present invention. Device 10 desirably is flexible to allow device 10 to be mounted to surfaces incorporating some curvature. In preferred embodiments, device 10 is sufficiently flexible to be wrapped around a mandrel having a diameter of 50 cm, preferably about 40 cm, more preferably about 25 cm without cracking at a temperature of 25° C. Device 10 includes a light incident face 12 that receives light rays 16 and a backside face 14.

Device 10 includes a substrate 18 that incorporates a chalcogenide-containing photovoltaic absorber region 20. Region 20 can be a single integral layer as illustrated or can be formed from one or more layers. The region 20 absorbs light energy embodied in the light rays 16 and then photovoltaically converts this light energy into electric energy.

The chalcogenide absorber region 20 preferably incorporates at least one IB-IIIB-chalcogenide, such as IB-IIIB-selenides, IB-IIIB-sulfides, and IB-IIIB-selenides-sulfides that include at least one of copper, indium, and/or gallium. In many embodiments, these materials are present in polycrystalline form. Advantageously, these materials exhibit excellent cross-sections for light absorption that allow region 20 to be very thin and flexible. In illustrative embodiments, a typical absorber region 20 may have a thickness in the range from about 1 µm to about 5 µm, preferably about 2 µm to about 3 µm.

Representative examples of such IB-IIIB-chalcogenides incorporate one or more of copper, indium, and/or gallium in addition to selenium and/or sulfur. Some embodiments include sulfides or selenides of copper and indium. Additional embodiments include selenides or sulfides of copper, indium, and gallium. Specific examples include but are not limited to copper indium selenides, copper indium gallium selenides, copper gallium selenides, copper indium sulfides, copper indium gallium sulfides, copper gallium selenides, copper indium sulfide selenides, copper gallium sulfide selenides, copper indium aluminum selenides and copper indium gallium sulfide selenides (all of which are referred to herein as CIGS) materials. The chalgogenide absorber may be doped with other materials such as sodium as is known in the art.

In representative embodiments, CIGS materials with photovoltaic properties may be represented by the formula $CuIn_{(1-x)}Ga_xSe_{(2-y)}S_y$, where x is 0 to 1 and y is 0 to 2. The copper indium selenides and copper indium gallium selenides are preferred. The absorber region 20 may be formed by any suitable method using a variety of one or more techniques such as evaporation, sputtering, electrodeposition, spraying, and sintering. One preferred method is co-evaporation of the constituent elements from one or more suitable targets, where the individual constituent elements are thermally evaporated on a hot surface coincidentally at the same time, sequentially, or a combination of these to form region 20. After deposition, the deposited materials may be subjected to one or more further treatments to finalize the region 20. In many embodiments, CIGS materials have p-type characteristics.

In addition to absorber region 20, substrate 18 may also include one or more other components including support 22, backside electrical contact region 24, buffer region 28, and transparent conducting oxide (TCO) region 30. As shown, each of these regions can be a single integral layer as illustrated or can be formed from one or more layers. Support 22 may be rigid or flexible, but desirably is flexible in those embodiments in which the device 10 may be used in combination with non-flat surfaces. Support 22 may be formed from a wide range of materials. These include glass, quartz, other ceramic materials, polymers, metals, metal alloys, intermetallic compositions, paper, woven or non-woven fabrics, combinations of these, and the like. Stainless steel is preferred.

The backside electrical contact region 24 provides a convenient way to electrically couple device 10 to external circuitry. Contact region 24 may be formed from a wide range of electrically conductive materials, including one or more of Cu, Mo, Ag, Al, Cr, Ni, Ti, Ta, Nb, W combinations of these, and the like. Conductive compositions incorporating Mo may be used in an illustrative embodiment. The backside electrical contact region 24 also helps to isolate the absorber region 20 from the support to minimize migration of support constituents into the absorber layer. For instance, backside electrical contact region 24 can help to block the migration of Fe and Ni constituents of a stainless steel support 22 into the absorber region 20. The backside electrical contact region 24 also can protect the support 22 such as by protecting against Se if Se is used in the formation of absorber region 20.

Optional layers (not shown) may be used proximal to backside face 14 in accordance with conventional practices now known or hereafter developed to help enhance adhesion between backside electrical contact region 24 and the support 22 and/or between backside electrical contact region 24 and the absorber region 20. Additionally, one or more barrier layers (not shown) also may be provided over the backside electrical contact region 24 to help isolate device 10 from the ambient and/or to electrically isolate device 10. One or more additional layers (not shown) may be deposited onto the backside of support 22 for a variety of reasons, including to help prevent selenization of the substrate during fabrication of the cell. Such one or more layers typically include molybdenum.

The device 10 when based upon chalcogenide materials often is provided with a heterojunction structure in contrast to silicon-based semiconductor cells that have a homojunction structure. A heterojunction may be formed between the absorber region 20 and the TCO region 30 buffered by buffer region 28. An optional window region 26 also may be present. Each of these regions is shown as a single integral layer, but can be a single integral layer as illustrated or can be formed from one or more layers. Buffer region 28 generally comprises an n-type semiconductor material with a suitable band gap to help form a p-n junction proximal to the interface 32 between the absorber region 20 and the buffer region 28. Suitable band gaps for the buffer region 28 generally are in the range from about 1.7 eV to about 3.6 eV when the absorber layer is a CIGS material having a band gap in the range from about 1.0 to about 1.6 eV. CdS has a band gap of about 2.4 eV.

Illustrative buffer layer embodiments generally may have a thickness in the range from about 10 nm to about 200 nm.

A wide range of n-type semiconductor materials may be used to form buffer region 28. Illustrative materials include selenides, sulfides, and/or oxides of one or more of cadmium, zinc, lead, indium, tin, combinations of these and the like, optionally doped with materials including one or more of fluorine, sodium, combinations of these and the like. In some illustrative embodiments, buffer region 28 is a selenide and/or sulfide including cadmium and optionally at least one other metal such as zinc. Other illustrative embodiments would include sulfides and/or selenides of zinc. Additional illustrative embodiments may incorporate oxides of tin doped with material(s) such as fluorine. A wide range of methods, such as for example, chemical bath deposition, partial electrolyte treatment, evaporation, sputtering, or other deposition technique, can be used to form buffer region 28.

Substrate 18 may include an optional window layer. Window region 26 can help to protect against shunts. Window region 26 also may protect buffer region 28 during subsequent deposition of the TCO region 30. The window region 26 may be formed from a wide range of materials and often is formed from a resistive, transparent oxide such as an oxide of Zn, In, Cd, Sn, combinations of these and the like. An exemplary window material is intrinsic ZnO. A typical window region 26 may have a thickness in the range from about 10 nm to about 200 nm, preferably about 50 nm to about 150 nm, more preferably about 80 nm to about 120 nm.

The TCO region 30 is interposed between the buffer region 28 and light incident surface 12 and is electrically coupled to the buffer region 28 to provide a top conductive electrode for substrate 18. In many suitable embodiments, the TCO layer has a thickness in the range from about 10 nm to about 1500 nm, preferably about 150 nm to about 200 nm. As shown, the TCO region 30 is in contact with the window region 26. As an example of another option, TCO region 30 might be in direct contact with the buffer region 28. One or more intervening layers optionally may be interposed for a variety of reasons such as to promote adhesion, enhance electrical performance, or the like.

A wide variety of transparent conducting oxides or combinations of these may be incorporated into the TCO region 30. Examples include fluorine-doped tin oxide, tin oxide, indium oxide, indium tin oxide (ITO), aluminum doped zinc oxide (AZO), zinc oxide, combinations of these, and the like. In one illustrative embodiment, the TCO region 30 is indium tin oxide. TCO layers are conveniently formed via sputtering or other suitable deposition technique.

Dielectric barrier region 34 and electrically conductive collection grid 36 are positioned over the substrate 18. The grid desirably at least includes conductive metals such as nickel, copper, silver, and the like and/or combinations thereof. In one illustrative embodiment, the grid has a dual layer construction comprising nickel and silver. Since these materials are not transparent, they are deposited as a grid of spaced apart lines so that the grid occupies a relatively small footprint on the surface (e.g., in some embodiments, the grid occupies about 5% or less, even about 2% or less, or even about 1% or less of the total surface area associated with light capture to allow the photoactive materials to be exposed to incident light). As shown, region 34 is a single layer. However, region 34 can be formed from more than one layer if desired.

As an overview of the methods of the present invention for forming these constituents of device 10, at least a portion of the barrier region 34 is formed prior to formation of at least a portion of the grid 36. Preferably, at least substantially all of barrier region 34 is formed before grid 36 is formed. Vias 38, exposing the TCO material in the TCO region 30, are provided in the region 34. At least a portion of grid 36 subsequently is formed in the vias 38, optionally using an adhesion promoting film (not shown) at the interface between the materials to complete a hermetic envelope to protect the underlying layers.

Advantageously, the methodologies of the present invention enhance the adhesion quality of the interface between the barrier region 34 and the grid 36 in the context of chalcogenide-based photovoltaic devices and in particular flexible CIGS-based devices. This methodology provides enhanced protection against delamination and moisture intrusion in that adhesion at the interface between the barrier region 34 and the grid 36 is improved. Device life is extended as a result. This is surprising because, if the grid 36 is formed first, delamination and water intrusion are much more likely to occur. Additionally, because the contacts 40 constituting portions of grid 36 project above the dielectric barrier layer, it is easy to make electrical connections to device 10 using standard, inexpensive techniques. In preferred embodiments, the portion of the contacts that project above region 34 are wider than the underlying via 38, this not only eases electrical connections but also creates a tortuous path at the interface between the contact 40 and the barrier region 34. This tortuous path makes it even more difficult for water to penetrate into device 10.

In more detail, dielectric barrier region 34 is formed from one or more suitable dielectric materials that have sufficiently low dielectric constants to help electrically isolate TCO region 34 from the ambient environment except in those locations where electric contact is desired through the electrical contacts 40 constituting elements of electrically conductive grid 36. In many embodiments, dielectric barrier region 34 has a dielectric constant in the range of 2 to about 120, preferably 2 to about 50, more preferably 3 to about 10. Additionally, dielectric region 34 also desirably provides barrier protection against water vapor intrusion. In many embodiments, dielectric barrier region 34 is characterized by a water vapor transmission rate (WVTR) in the range of $10^0$ to about $10^{-5}$ g/m$^2$·day, but is most preferably less than $5 \times 10^{-4}$ g/m$^2$·day. The WVTR for a material may be determined according to the methodology described in ASTM E 96 or in other tests such as the calcium test (Wolf et al. Plasma Processes and Polymers, 2007, 4, S185-S189).

The dielectric barrier region 34 may be formed from a variety of material(s). Preferably, the materials used in barrier region 34 are nonporous. The barrier coatings useful in this invention preferably exhibit optical transmittance ≥80% in the transmission wavelength range 400-1300 nm and more preferably exhibit ≥85% transmission in the same range.

Dielectric barrier region 34 may have a wide range of thicknesses. If too thin, then the electric insulating properties and protection against moisture intrusion may not be as robust as might be desired. If too thick, then transparency may unduly suffer without providing sufficient extra performance. Balancing these concerns, illustrative embodiments of barrier region 34 may have a thickness in the range of 10 nm to about 1000 nm, preferably about 10 nm to about 250 nm, more preferably about 50 nm to about 150 nm.

Dielectric barrier region 34 can be selected from a group of metal oxides, carbides, nitrides and the like or combinations thereof. In one preferred embodiment, the barrier material is an oxide and/or nitride of silicon. These embodiments provide excellent dielectric and moisture protection. In some embodiments, dielectric barrier region 34 preferably is formed from silicon nitride or a material incorporating silicon, nitrogen, and oxygen (a silicon oxy nitride). In other embodiments in which dielectric barrier region 34 is formed from two or more sublayers, a first sublayer may be formed from silicon nitride, and a second sublayer may be formed from a silicon oxy nitride. When two or more sublayers are used, it is preferred that the bottom layer (i.e., the layer in contact with the TCO layer) be silicon nitride.

Representative embodiments of silicon nitride may be represented by the formula SiN$_x$, and representative embodiments of silicon oxy nitride may be represented by the formula SiO$_y$N$_z$, wherein x is in the range from about 1.2 to about 1.5, preferably about 1.3 to about 1.4; y is preferably in the range from greater than 0 to about 0.8, preferably from about 0.1 to about 0.5; and z is in the range from about 0.8 to about 1.4, preferably about 1.0 to about 1.3. Desirably, x, y, and z are selected so that the barrier region 34, or each sublayer thereof as appropriate, has a refractive index in the range from about 1.80 to about 3. As an example of one suitable embodiment, silicon nitride of the formula SiN$_{1.3}$ and having a refractive index of 2.03 would be suitable in the practice of the present invention.

The dielectric barrier region 34 can be formed on the TCO region 30 in a variety of ways. According to one representative methodology, the dielectric barrier region 34 is deposited on the solar cell by a low temperature method carried out at less than about 200° C., preferably less than about 150° C., more preferably less than about 100° C. The temperature in this context refers to the temperature at the surface where deposition is occurring. Preferably, the inorganic barrier is deposited via magnetron sputtering. Where a preferred silicon nitride layer is to be formed, the dielectric barrier layer preferably is deposited via reactive magnetron sputtering using a silicon target and a mixture of nitrogen and argon gas. The mole fraction of nitrogen in the gas feed is preferably more than 0.1, more preferably more than 0.2 and preferably less than 1.0, more preferably less than 0.5. Prior to the deposition, a suitable base pressure in the chamber is in the range from about $1 \times 10^{-8}$ to about $1 \times 10^{-5}$ Torr. The operating pressure at which sputtering occurs desirably is in the range from about 2 mTorr to about 10 mTorr.

When these sputtering conditions are used to form dielectric barrier region 34, it is believed that an interstitial, relatively thin sublayer (not shown) desirably forms proximal to the interface between TCO region 30 and the dielectric barrier region 34. A thicker dielectric sublayer (not shown) of the dielectric barrier region 34 forms above that. Based on the contrast difference shown in scanning electron microscopy (SEM) analysis, it is believed that the interstitial sublayer appears to be of lower density compared to the bulk of region 34. Characterization of the elemental composition of the interstitial sublayer may tend to have an oxygen content greater than that in the bulk of region 34. Without wishing to be bound it is postulated that the formation of this interstitial sublayer may be beneficial to the environmental barrier properties of the region 34 and also may facilitate the reduction/healing of lattice defects caused by excessive electron and ion bombardment during film formation. This methodology of using a low temperature process to deposit the dielectric barrier region 34 is further described in Assignee's co-pending application filed in the names of DeGroot et al. for METHOD OF FORMING A PROTECTIVE LAYER ON THIN-FILM PHOTOVOLTAIC ARTICLES AND ARTICLES MADE WITH SUCH LAYER on Mar. 25, 2009, and bearing Attorney Docket No. 67695 (now published as US2010/0243046).

As an option, the dielectric barrier region 34 also may be prepared by other methodologies, including but not limited to low temperature vacuum methods known to those skilled in the art including chemical vapor deposition (CVD), plasma-enhanced chemical vapor deposition (PECVD), atomic layer deposition (ALD) and others.

Preferred embodiments of the dielectric barrier region 34 exhibit optical transmittance ≥80% in the transmission wavelength range from about 400 nm to about 1300 nm and preferably exhibit ≥85% transmission in the same range. Additionally, preferred embodiments of the dielectric barrier region 34 may exhibit a water vapor transmission rate less than $1 \times 10^{-2}$ g/m$^2$·day and preferably less than $5 \times 10^{-4}$ g/m$^2$·day. The dielectric barrier region 34 can be applied as a single layer or as multiple sublayers.

At least one via 38 is present in the dielectric barrier region 34. For purposes of illustration, two vias are shown. Vias 38 may be formed in region 34 in a variety of ways. According to one option, the vias 38 can be formed by masking corresponding areas of the underlying structure. The dielectric material may then be deposited over the underlying structure after which the masking is removed to reveal the vias 38 through the dielectric. The vias 38 also can be formed post-deposition by removing portions of the dielectric barrier region 34 after the region 34 is formed but prior to formation of the electrical contacts 40. Material removal can occur in a variety of ways such as by laser ablation, chemical etching in the presence of a mask, photolithography, combinations of these, and the like. When the vias 38 are filled with grid constituents, described further below, the barrier region 34 and the grid 36 cooperate to form a hermetic envelope over device 10.

As illustrated, at least one via 38 extends from surface 12 to a bottom 44 that exposes TCO region 30 before grid constituents are formed. As shown, the bottom 44 of at least one via 38 ends proximal to surface 44. In other embodiments (not shown), the bottom 44 may be positioned such that via 38 penetrates into but not through the TCO region 30. This allows electrical contacts 40 to be electrically connected to the TCO layer. So long as the device 10 includes at least one via 38 having this architecture, other vias that penetrate to lesser or greater extents into device 10 may be used if desired. More preferably, though, at least a majority, and preferably at least substantially all of the vias formed in the region 34 terminate at or within the TCO region 30.

Electrical contacts 40 constituting at least a portion of electrically conductive grid 36, are formed in vias 38 and are electrically connected to the TCO region 30. Providing at least one contact 40 that is connected to the TCO region 30, rather than to another layer deeper in device 10, provides numerous advantages. First, to the extent that water is able to penetrate into device 10 along the sides of contacts 40, the contact 40 extends only down to the depth of the TCO region 34. Thus, deeper layers of device 10, such as the chalcogenide-based absorber region 20 are more protected from water intrusion. In some embodiments of the invention, only a portion of the vias 38 and contacts 40 formed in the vias extend to the depth of the TCO layer and no further, while other vias and contacts might extend into device 10 to a greater or lesser degree. More preferably, however, at least substantially all of the vias 38 and contacts 40 extend to the TCO region 30 without penetrating all the way through the TCO region 30.

Each contact 40 includes a base 48 within the via and a cap 50 projecting above light incident surface 12 of the dielectric barrier region 34. The projecting cap 50 makes it easy to make electrical connections to the grid 36. At least a portion of cap 50 as shown in this embodiment is wider in at least one dimension than at least a portion of the underlying via 38. This creates a tortuous pathway that substantially minimizes, and even substantially eliminates, water intrusion. Base 48 and cap 50 can be integrally formed as shown or can be formed from two or more components.

Cap 50 may have a wide range of thicknesses. In illustrative embodiments, cap 50 has a thickness in the range from about 0.05 μm to about 50 μm, preferably about 0.1 μm to about 25 μm, more preferably about 1.0 μm to about 10 μm.

Electrical contacts 40 can be formed from a wide range of electrically conducting materials, but most desirably are formed from one or more metals, metal alloys, or intermetallic compositions. Exemplary contact materials include one or more of Ag, Al, Cu, Cr, Ni, Ti, combinations of these, and the like. Contacts 40 incorporating Ag are preferred.

To improve the adhesion quality of the interface between the contacts 40 and the walls of the vias 38, an optional adhesion promoting film 56 may be used at all or a portion of this interface. As shown in FIG. 1, the film 56 lines substantially all of the via 38. Use of film 56 helps to make device 10 even more robust against delamination, water attack, or other degradation. In a typical embodiment, the film 56 has a thickness in the range from about 10 nm to about 500 nm, preferably about 25 nm to about 250 nm, more preferably about 50 nm to about 100 nm. Film 56 can be formed from a wide range of materials. Preferred embodiments of film 56 incorporate electrically conductive metal constituents such as Ni. Film 56 is formed in vias 38 prior to deposition of contacts 40.

An optional region (not shown) may include one or more additional barrier layers provided over the dielectric barrier region 34 to help further protect device 10. In many modes of practice, these additional barrier layers, if any, are incorporated into device 10 after desired electrical connections are made to grid 36. If an optional region is used, the top surface 58 of the cap 50 may also be coated with an adhesion promoting film (not shown). This upper film can be formed from the same material(s) as are used in film 56, but can also be formed from a wider range of materials inasmuch as such an upper film need not be electrically conductive. If such an upper film were to be formed from a dielectric or other insulating materials, the upper film can be formed after electrical contacts are made to grid 36. Alternatively, the upper film can be formed prior to making electrical connections in a manner that leaves appropriate vias available to make desired electrical connections.

In a preferred aspect, at least a portion of the dielectric barrier region 34 is incorporated into device 10 before at least a portion of the grid 36 is formed. When the dielectric barrier region 34 is formed first, the interface between the contacts 40 and the barrier region 34 is very robust against delamination, cracking, and water penetration. The quality of the interface is enhanced greatly when optional film 56 is used, particularly when Ni constitutes a portion of the film 56, preferably at least 50%, more preferably at least about 90% of the optional film 56, particularly when contact 40 incorporates silver on a molar basis. In contrast, the interface between the contacts 40 and the barrier region 34 is less robust when the entirety of grid 36 is formed entirely prior to the barrier region 34.

The present invention will now be described with reference to the following illustrative examples.

EXAMPLE 1

On 1"×1" pieces of soda-lime glass, substrates comprising a sputter-deposited thin film of aluminum (about 30 nm), followed by an indium tin oxide (ITO) layer of 130 nm thickness were prepared. Indium tin oxide (ITO) films were prepared using a custom RF magnetron sputter chamber from a 100 mm diameter, 5 mm thick ITO ceramic target (90 wt % $In_2O_3$, 10 wt % $SnO_2$) using gas flows of argon (14 sccm) and oxygen (2 sccm), controlled using mass flow controllers, to achieve a working gas pressure of 2.8 mTorr. The substrate temperature was held at 150° C. during deposition. A strip of Kapton tape (1 mm×5 mm) was applied to mask an area of the sample. A 178 nm thick layer of silicon nitride was sputter-deposited over the ITO and the tape. The silicon nitride was deposited via reactive sputtering using a boron-doped silicon target and a 50:50 $Ar:N_2$ gas ratio. The pressure during deposition was controlled at 4.0 mTorr, the power is set at 140 W and the chamber platen was in rotational mode. The target to substrate distance was 75 mm. The silicon nitride film deposition rate was approximately 40 Å/min. Prior to the deposition, the system was pumped down to a base pressure of $9\times10^{-6}$ Torr. The tape was then carefully removed to expose the bare ITO layer underneath the silicon nitride. A mask was applied to cover the whole sample with the exception of a rectangular surface (void) slightly larger than that of the exposed ITO.

Layers of Ni and then Ag having a total thickness of about 1600 nm were sequentially evaporated over the mask, thus depositing a conductive grid that covered the exposed ITO completely. The Ni and Ag layers are deposited sequentially by E-beam evaporation on a Denton Explorer 14 system. Prior to evaporation, the chamber base pressure is reduced to $<2\times10^{-6}$ Torr. All depositions were carried out at 9.0 kV, while current values are 0.130 and 0.042 Amps for Ni and Ag, respectively. The deposition rates were controlled in process using a Maxtek 260 quartz crystal deposition controller at 2.0 Å/s and 15.0 Å/s for Ni and Ag, respectively. Ni shots (99.9999%, obtained from International Advanced Materials) were evaporated from a 7 cc aluminum crucible, while Ag pellets (99.9999%, Alfa Aesar) were evaporated from a 7 cc molybdenum crucible.

A cross-section image (FIB-SEM) of the resultant structure shows the Ni/Ag grid overlapping the silicon nitride layer, as well as the ITO in an area where there was no silicon nitride and contact is made directly between the ITO and the Ni/Ag grid contact. Upon this visual inspection, the contact was strongly bonded to the silicon nitride.

EXAMPLE 2

Onto three (3) 1"×1" pieces of soda-lime glass were sputter-deposited a thin film of aluminum (about 30 nm). A strip of Kapton tape (1 mm×5 mm) was applied to mask an area of each sample. A 150 nm thick layer of silicon nitride was sputter-deposited over the aluminum and the tape for each sample using identical conditions to those described in Example 1. The strips of tape were then carefully removed to expose the bare aluminum layer underneath silicon nitride. For each sample, a mask was applied to cover the whole substrate with the exception of a rectangular surface slightly larger than that of the exposed aluminum. Layers of Ni followed by Ag having a total thickness of about 1600 nm were evaporated over the mask using the conditions described in Example 1, thus depositing a conductive grid, which covered the exposed aluminum completely.

Figure 2:
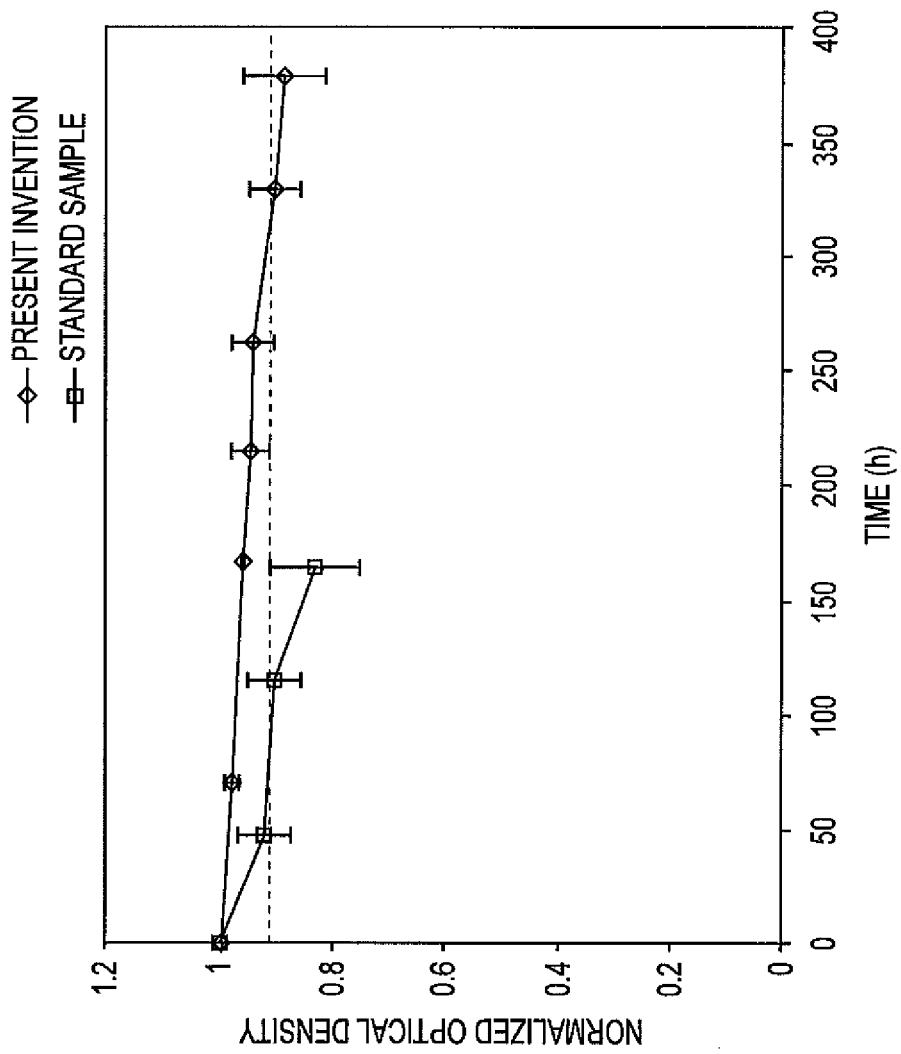
FIG. 2 is a graph comprising optical density characteristics as a means to measure moisture barrier quality of present invention samples to a comparison.

The samples were then placed in a pressure vessel at 115° C./100% relative humidity and 12 psig for accelerated exposure testing. Optical density data is shown in FIG. 2. The data represents an average of the performance of the three samples. Optical density of the aluminum film is measured to determine the extent of oxidation to aluminum oxide from reaction with water. The formation of a more transparent aluminum oxide layer leads to a decrease in optical density. In the plot shown in FIG. 2, the optical density data from the samples prepared (labeled "Present Invention") are compared with that of samples prepared by a standard procedure. The standard samples were comprised of a similar construction as the "Present Invention" sample with the exception that the Ni/Ag grids were directly deposited over the ITO layer, followed by deposition of silicon nitride over the ITO/grid structure. The results demonstrate the significant improvement in moisture barrier performance achieved when practicing principles of the present invention.

EXAMPLE 3

On a 1"×1" (about 2.5 cm×2.5 cm) piece of soda-lime glass were sputter-deposited a thin film of aluminum (about 30 nm), followed by an indium tin oxide (ITO) layer of 130 nm thickness. Two strips of Kapton tape (1 mm×5 mm each) were applied to mask two distinct areas of the sample. A 150 nm thick layer of silicon nitride was sputter-deposited over the ITO and both strips of tape using the same chamber and conditions as described in Example 1. The strips were then carefully removed to expose the bare ITO layer underneath silicon nitride. A mask was applied to cover the whole sample with the exception of one rectangular surface slightly larger than that of one of the exposed ITO areas. Sequential layers of Ni followed by Ag having a total thickness of 1600 nm were evaporated under the conditions described in Example 1 over the mask, thus depositing a conductive grid, which covers one of the exposed areas of ITO completely.

Conductivity measurements demonstrate that conductivity between the ITO layer and the Ni/Ag grid is preserved:

| Electrical connection: | Resistivity: |
|---|---|
| Grid-Grid | 0.5 (<1) $\Omega \cdot$ cm |
| ITO-ITO | 5.3-6.3 $\Omega \cdot$ cm |
| Grid-SiN$_x$ | no conductivity |
| Grid-ITO | 3.8-4.5 $\Omega \cdot$ cm |

Other embodiments of this invention will be apparent to those skilled in the art upon consideration of this specification or from practice of the invention disclosed herein. Various omissions, modifications, and changes to the principles and embodiments described herein may be made by one skilled in the art without departing from the true scope and spirit of the invention which is indicated by the following claims.

What is claimed is:

1. A method of making a photovoltaic device, comprising the steps of:
   a) providing a substrate having a light incident surface and a backside surface and comprising at least one photovoltaic absorber, wherein the substrate includes at least one transparent conducting oxide layer interposed between the absorber and the light incident surface and wherein the at least one photovoltaic absorber comprises a chalcogenide-containing photovoltaic absorber having a thickness of 5 micrometers or less;
   b) causing a dielectric barrier layer to be positioned over the transparent conducting oxide layer;
   c) forming at least one via in the dielectric barrier layer that terminates at a location in the device such that the via provides open communication to the transparent conducting oxide layer through the dielectric barrier layer without penetrating all the way through the transparent conducting oxide layer; and
   d) forming an electrical contact that is electrically connected to the transparent conducting oxide layer, said electrical contact comprising a base formed in the via and a cap projecting above the dielectric barrier layer, wherein the cap of the electrical contact is wider than the base of the electrical contact in at least one dimension.

2. The method of claim 1, further comprising the step of causing a conductive film comprising nickel to be interposed between the electrical contact and at least one of the via and the transparent conducting oxide layer.

3. The method of any claim 1, further comprising the step of causing an adhesion promoting, conductive film to be interposed between the electrical contact and at least one of the via and the transparent conducting oxide.

4. The method of claim 1, further comprising the step of incorporating at least one additional barrier layer that overlies the dielectric barrier layer and the electrical contact.

5. The method of claim 1, wherein the cap of the electrical contact is wider than the via in at least one dimension.

6. The method of claim 1, further comprising the step of causing a buffer layer to be positioned between the absorber and transparent conductive oxide.

7. The method of claim 1, wherein step (b) comprises forming the dielectric layer at a temperature of about 100° C. or less, wherein the dielectric layer incorporates at least silicon and nitrogen.

8. The method of claim 1, wherein the dielectric layer comprises a silicon compound having the formula $SiO_yN_z$, wherein y is less than about 0.05 and z is in the range from about 1.1 to about 1.4.

9. The method of claim 1, wherein the transparent conducting oxide incorporates at least one of indium, zinc, tin, and aluminum.

10. The method of claim 1, wherein the dielectric barrier layer has a thickness in the range from about 10 to about 1000 nm.

11. The method of claim 1, wherein the electrical contact incorporates at least one of Ag, Al, Cu, Cr, Ni, and Ti.

* * * * *